United States Patent
Kai et al.

(10) Patent No.: US 8,098,010 B2
(45) Date of Patent: Jan. 17, 2012

(54) ORGANIC ELECTROLUMINESCENCE DISPLAY DEVICE AND MANUFACTURING METHOD THEREOF

(75) Inventors: Kazuhiko Kai, Mobara (JP); Masato Ito, Mobara (JP)

(73) Assignees: Hitachi Displays, Ltd., Chiba (JP); Panasonic Liquid Crystal Display Co., Ltd., Hyogo-ken (JP)

( * ) Notice: Subject to any disclaimer, the term of this patent is extended or adjusted under 35 U.S.C. 154(b) by 496 days.

(21) Appl. No.: 12/272,897

(22) Filed: Nov. 18, 2008

(65) Prior Publication Data

US 2009/0128030 A1    May 21, 2009

(30) Foreign Application Priority Data

Nov. 19, 2007   (JP) .................................. 2007-299134

(51) Int. Cl.
  *H01L 27/32* (2006.01)
  *H01L 27/28* (2006.01)
(52) U.S. Cl. ............ 313/512; 313/504; 445/23; 445/24; 445/25
(58) Field of Classification Search .......... 313/498–512; 445/23–25
See application file for complete search history.

(56) References Cited

U.S. PATENT DOCUMENTS

| | | | |
|---|---|---|---|
| 6,936,964 B2 * | 8/2005 | Cok ................. | 313/512 |
| 2004/0150319 A1 * | 8/2004 | Tomimatsu et al. ........... | 313/495 |
| 2005/0110404 A1 * | 5/2005 | Park et al. ................ | 313/512 |
| 2007/0090759 A1 * | 4/2007 | Choi et al. ................ | 313/512 |
| 2007/0120481 A1 * | 5/2007 | Aita .................... | 313/512 |
| 2007/0222384 A1 * | 9/2007 | Yonemoto ............... | 313/512 |

FOREIGN PATENT DOCUMENTS

| | | |
|---|---|---|
| JP | 2004-139977 | 5/2004 |
| JP | 2007-073225 | 3/2007 |

OTHER PUBLICATIONS

Nikkei Electronics No. 960, pp. 10-11, Sep. 10, 2007, Nikkei Business Publications, Inc.; Shinya Saeki.

* cited by examiner

*Primary Examiner* — Joseph L Williams
*Assistant Examiner* — Nathaniel Lee
(74) *Attorney, Agent, or Firm* — Antonelli, Terry, Stout & Kraus, LLP.

(57) ABSTRACT

A solid sealing method of an organic EL display device is provided which effectively prevents influences of moisture and reduces manufacturing cost. A mother sealing sheet (400) and a mother element substrate (100) are adhered with a use of a positioning mark (+). A rectangular portion shown in a dotted line on the mother sealing sheet (400) is a separation line (41). An adhesive member is formed in the separation line (41), and the adhesive member is adhered to a display region (101) formed over the mother element substrate (100). A cut-out is formed at a corner portion and a short side portion of the rectangular separation line (41) and a cut-out and a bridge are formed on the long side portion. Thus, unnecessary portion of the mother sealing sheet can be removed without losing the reliability of adhesion.

13 Claims, 11 Drawing Sheets

DETACHMENT DIRECTION

DETACHMENT DIRECTION

ORGANIC ELECTROLUMINESCENCE DISPLAY DEVICE AND MANUFACTURING METHOD THEREOF

CROSS-REFERENCE TO RELATED APPLICATION

The present application claims priority from Japanese application JP 2007-299134 filed on Nov. 19, 2007, the content of which is hereby incorporated by reference into this application.

BACKGROUND OF THE INVENTION

1. Field of the Invention

The present invention relates to an organic electroluminescence (hereinafter referred to as "EL") display device, and, in particular, to an organic electroluminescence display device having a high reliability in which occurrence of dark spots or the like due to moisture is suppressed.

2. Description of the Related Art

In an organic EL display device, an organic EL layer is sandwiched between a pixel electrode (lower electrode) and an upper electrode, a constant voltage is applied to the upper electrode, and a data signal voltage is applied to the lower electrode, to control light emission of the organic EL layer. And an organic EL display device forms an image. The supply of the data signal voltage to the lower electrode is executed through a thin film transistor (TFT). Organic EL display devices include a bottom-emission type in which the light emitted from the organic EL layer is emitted to a direction toward the glass substrate over which the organic EL layer or the like is formed and a top-emission type in which the light is emitted to a direction opposite to the direction toward the glass substrate over which the organic EL layer or the like is formed.

In the organic EL material which is used for the organic EL display device, the light emission characteristic is degraded when moisture is present. Because of this, when the organic EL display device is operated for a long period of time, locations where the organic EL material is degraded by the moisture stops emitting light. This location appears as a dark spot in the display region. The dark spot grows as time elapses, and becomes a defect of an image. Edge growth which is a phenomenon in which a region where the light is not emitted around the pixel increases is also caused by influence of the moisture.

In order to prevent occurrence or growth of the dark spot or the like, it is necessary to prevent intrusion of moisture into the organic EL display device or to remove the intruded moisture in the organic EL display device. For this purpose, an element substrate over which the organic EL layer is formed is sealed with a sealing substrate via a seal provided at the periphery, so that the intrusion of moisture into the organic EL display device from the outside is prevented. Then, the inside space which is sealed is filled with inert gas such as $N_2$. In addition, in order to remove moisture which entered the organic EL display device, a desiccant is provided within the organic EL display device. Such an organic EL display device is called a hollow-seal organic EL display device.

In a hollow-seal organic EL display device, there are known problems such as that adjustment of the gap between the element substrate and the sealing substrate is difficult, that the adjustment inside the sealed space is difficult, that the organic EL material is contaminated by the gas discharged from the sealing agent when the substrates are sealed with the sealing agent, that the throughput is reduced, etc.

As a countermeasure to the problems of the hollow sealing, there is known a technique in which a resin sheet having a determined thickness is sandwiched between the element substrate and the sealing substrate and the organic EL material is protected from moisture with the resin sheet. This technique is called a solid sealing.

JP 2004-139977 A discloses an example of the solid sealing. FIGS. 18A, 18B, 18C, and 18D show a structure disclosed in JP 2004-139977 A. In FIGS. 18A, 18B, 18C, and 18D, a photo-curing resin 120 which is formed over a light-transmissive film 110 is affixed over an element substrate 10 over which an organic EL layer 22 is provided, using a pressure roller 105 which is heated to a temperature of 80° C. Then, ultraviolet ray is irradiated, to cure the photo-curing resin 120. The light-transmissive film 110 is removed, so that an organic EL display device which is sealed with the photo-curing resin 120 is obtained. In addition, this reference discloses a structure in which the organic EL element is covered with a silicon nitride film as necessary.

An article by Shinya SAEKI, Nikkei Electronics, Sep. 10, 2007, No. 960, pp. 10-11 discloses the following technique for sealing an organic EL display device, as shown in FIGS. 19A, 19B, 19C, 19D, and 19E. A resin film 107 is affixed on a location over a sealing substrate 40 corresponding to the location of an organic EL element 22, and a sealing agent 108 is drawn at the periphery of the resin film 107. The sealing substrate 40 over which the resin film 107 and the sealing agent 108 are formed and an element substrate 10 over which the organic EL element 22 is formed are affixed. Then, ultraviolet ray is irradiated from the side of the sealing substrate 40, and a thermal process of 80° C.-100° C. is applied so that the sealing agent 108 is cured and the resin film 107 now having a flowability spreads in and fills a space formed by the sealing substrate 40, the element substrate 10, and the sealing agent 108. Finally, the structure is divided into individual organic EL display panels. In this manner, an organic EL display panel is completed.

JP 2007-73225 A discloses a structure in which an adhesive member is formed on a flexible sealing member in which a separation region is formed, and this member is adhered to the glass substrate over which a plurality of organic EL elements are formed. JP 2007-73225 A discloses a structure in which, in order to separate only the portion of the flexible sealing member over which the adhesive member is formed and leave this portion over the organic EL display panel, a perforation or a half-cut portion for distinguishing the separation portion and the portion to be removed is formed at a boundary between the separation portion and the portion to be removed.

SUMMARY OF THE INVENTION

JP 2004-139977 A discloses a structure in which a resin sheet is adhered to individual organic EL display device and the organic EL layer is protected. However, there is no description or suggestion of problems or the like when the organic EL panel is covered with the resin sheet in cases where a plurality of organic EL panels are formed in a mother substrate and are then separated.

In the technique described in Shinya SAEKI, Nikkei Electronics, Sep. 10, 2007, No. 960, pp. 10-11, the height of the resin film and the height of the sealing agent must be balanced. If the heights are not balanced, the lifetime of the organic EL display device would be degraded. In addition, because the resin film shows flowability and spreads in the thermal process after sealing, the pressure inside the organic EL display device is increased. In this case, a leak path with the outside may be formed, and the lifetime of the organic EL display device may be degraded. In addition, because of the influence of the degassing resin sheet when the sealing agent is cured, the sealing capability may be reduced.

In the technique of JP 2007-73225 A, a separation line by a perforation or a half-cut portion is formed in order to separate only a region to be left over the organic EL display panel where the adhesive member is formed, of the large-size flexible sealing substrate. However, there is no description of how the sealing portion is separately left along the separation line. In reality, the separation is not easy with only the perforation or the half-cut, and a problem may be caused in which the end of the remaining sealing member may be turned up.

A problem to be solved by the present invention is to realize a method of manufacturing a display device such as an organic EL display device in which an adhesive member is formed over only a necessary portion of a large-size sealing sheet and an unnecessary portion of the large-size sealing sheet is removed, wherein a separation method is provided which is highly reliable and which has a high manufacturing yield for separating the necessary portion and the unnecessary portion of the large-size sealing sheet.

The present invention solves at least the problem described above, and according to various aspects of the present invention, there are provided:

(1) a method of manufacturing an organic electroluminescence display device which comprises an element substrate having a display region and a terminal portion and in which an adhesive member is formed covering the display region and a sealing sheet is adhered to the adhesive member, the method comprising positioning and adhering a mother sealing sheet in which a plurality of the sealing sheets are formed and a mother element substrate in which a plurality of the element substrates are formed, wherein a rectangular separation line is formed on the mother sealing sheet surrounding a portion over which the adhesive member is formed, a cut-out is formed at a corner portion of the rectangular separation line, and a perforation is formed on a long side and a short side of the rectangle, forming a mother panel by removing, at the separation line, a portion which is not used as the sealing sheet in the organic electroluminescence display device, and separating individual organic electroluminescence display device from the mother panel;

(2) a method of manufacturing an organic electroluminescence display device according to (1), wherein the mother sealing sheet comprises a resin;

(3) a method of manufacturing an organic electroluminescence display device which comprises an element substrate having a display region and a terminal portion and in which an adhesive member is formed covering the display region and a sealing sheet is adhered to the adhesive member, the method comprising positioning and adhering a mother sealing sheet in which a plurality of the sealing sheets are formed and a mother element substrate in which a plurality of the element substrates are formed, wherein a rectangular separation line is formed on the mother sealing sheet surrounding a portion over which the adhesive member is formed and a cut-out is formed at a corner portion and an overall short side portion of the rectangular separation line, forming a mother panel by removing, at the separation line, a portion which is not used as the sealing sheet in the organic electroluminescence display device, and separating individual organic electroluminescence display device from the mother panel;

(4) a method of manufacturing an organic electroluminescence display device according to (3), wherein a perforation is formed on a long side of the rectangular separation line;

(5) a method of manufacturing an organic electroluminescence display device according to (3) wherein a cut-out portion and a bridge portion are alternately formed on a long side of the rectangular separation line;

(6) a method of manufacturing an organic electroluminescence display device according to (3) wherein a cut-out portion and a bridge portion are alternately formed on a long side of the rectangular separation line, and ratios of the cut-out portion and the bridge portion are such that the ratio of the cut-out portion is increased at positions nearer to the corner portion of the rectangle;

(7) a method of manufacturing an organic electroluminescence display device according to (3) wherein the bridging portion and the cut-out portion have thicknesses which are thinner than thicknesses in other portions of the sealing sheet;

(8) an organic electroluminescence display device which comprises a rectangular element substrate having a display region and a terminal portion and in which an adhesive member is formed covering the display region and a rectangular sealing sheet is adhered to the adhesive member, wherein the sealing sheet has a cutting surface at a corner portion, and a breaking surface is formed on the short side portion and the long side portion;

(9) an organic electroluminescence display device which comprises a rectangular element substrate having a display region and a terminal portion and in which an adhesive member is formed covering the display region and a rectangular sealing sheet is adhered to the adhesive member, wherein the sealing sheet has a cutting surface at a corner portion and an overall short side portion, and a breaking surface and a cutting surface are alternately formed on a long side portion;

(10) an organic electroluminescence display device according to (9) wherein ratios of the cutting surface and the breaking surface at the long side portion of the sealing sheet are such that the ratio of the cutting surface is greater than the ratio of the breaking surface at positions nearer to the corner portion of the rectangle than a center portion of the long side; and (11) an organic electroluminescence display device according to (10) wherein, the breaking surface and the cutting surface at the long side portion of the sealing sheet have thicknesses which are thinner than thicknesses of other portions of the sealing sheet.

Because a step of positioning, with a positioning mark, the mother sealing sheet in which a plurality of the sealing sheets are formed and a mother element substrate in which a plurality of the element substrates are formed is provided, it is possible to accurately match the adhesive member formed over the mother sealing sheet and the display portion of the organic electroluminescence element formed over the mother element substrate. For this positioning, techniques which are known to be effective in positioning a TFT substrate and a color filter substrate which is used in manufacturing of liquid crystal display devices maybe used.

Because a rectangular separation line is formed surrounding a portion of the mother sealing sheet in which the adhesive member is formed, and a cut-out is formed in the rectangular separation line at the corner portion on which a large stress is applied when the unnecessary portion of the mother sealing sheet is removed, it is possible to alleviate the stress when the unnecessary portion of the mother sealing sheet is removed, and to improve the reliability of the organic electroluminescence element.

According to another aspect of the present invention, because a rectangular separation line is formed surrounding a portion of the mother sealing sheet in which the adhesive member is formed and a cut-out is formed at the corner portion and the entire short side portion of the rectangular separation line on which a large stress is applied when the unnecessary portion of the mother sealing sheet is removed, it is possible to alleviate the stress when the unnecessary portion of the mother sealing sheet is removed, and to improve the reliability of the organic electroluminescence element.

With the present invention, a plurality of solid sealing organic electroluminescence display devices can be simultaneously manufactured using a mother element substrate, and, thus, the manufacturing cost can be reduced. In addition, organic electroluminescence display devices manufactured through the present invention has a high reliability.

DESCRIPTION OF THE PREFERRED EMBODIMENTS

Figure 1:
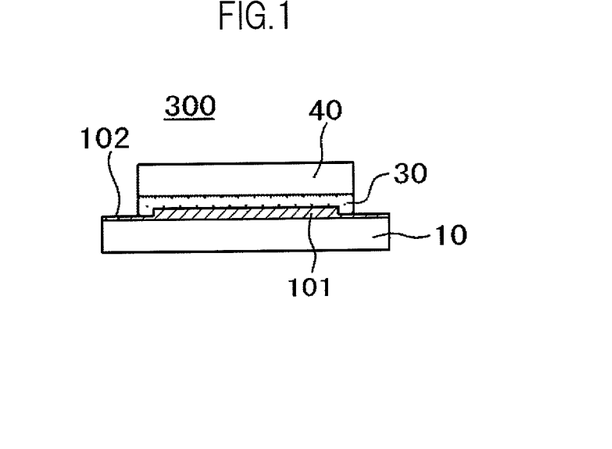
FIG. 1 is a cross sectional view of an organic EL display device according to a preferred embodiment of the present invention.

Before the preferred embodiments of the present invention are described in detail, a structure of an organic EL display device to which the present invention is applied will be described. FIG. 1 is a cross sectional view of an organic EL display panel 300 forming a part of an organic EL display device of the present invention. In FIG. 1, a display region 101 in which organic EL layers for displaying an image and thin film transistors for driving, or the like, are formed in a matrix form is formed over an element substrate 10.

An adhesive member 30 which also has a function of sealing is placed covering the display region 101. The adhesive member 30 also has a function of a seal member. A sealing sheet 40 is adhered to the element substrate 10 via the adhesive member 30. The sealing sheet 40 may comprise a resin or may comprise a thin glass. When a resin is used, a material such as, for example, an acrylic sheet is used.

Figure 2:
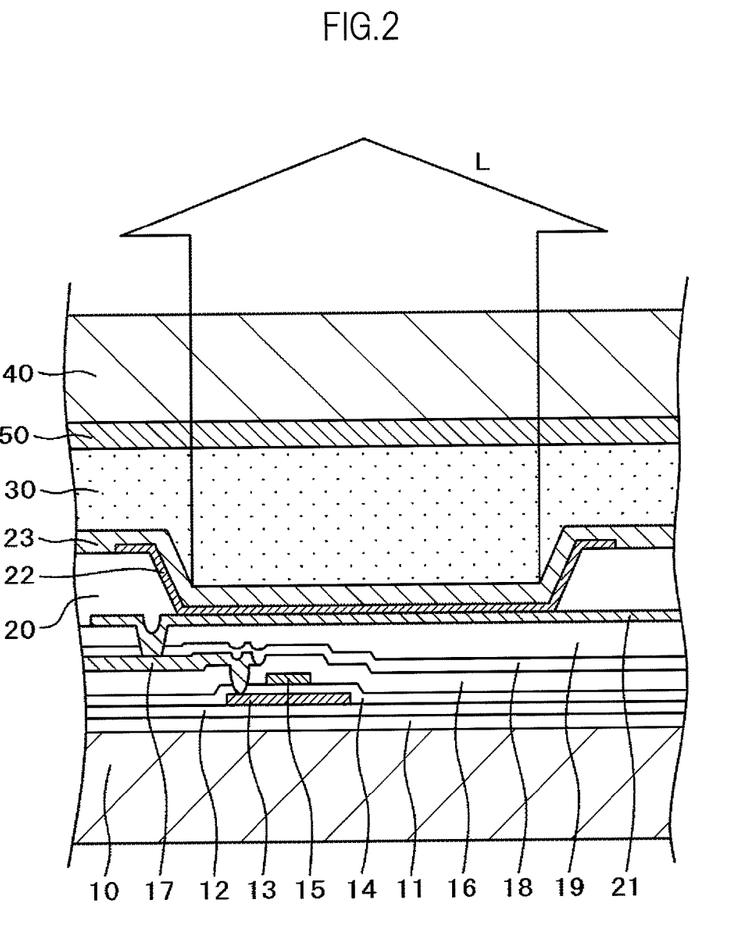
FIG. 2 is a cross sectional view of a display region of an organic EL display device according to a preferred embodiment of the present invention.

When a resin is employed for the sealing sheet 40, moisture may penetrate into the organic EL layer through the resin. Therefore, as shown in FIG. 2, a structure may be employed in which a moisture blocking layer 50 which blocks moisture is formed through sputtering or evaporation of a metal such as Ni, between the sealing sheet 40 and the adhesive member 30. In top-emission type organic EL display devices, however, because the light is emitted from the side of the sealing sheet 40, the configuration of a metal as the moisture blocking layer 40 is not preferable from the viewpoint of transmittance of light. In the case of the top-emission type organic EL display device, for example, in place of a metal, a material such as SiOx, SiNx, or SiNxPy may be formed through sputtering. Alternatively, glass may be formed through sputtering or the like.

As the adhesive member 30, a thermosetting epoxy resin is used. The thickness of the adhesive member 30 is 10 μm-20 μm. The adhesive member 30 is not limited to the epoxy resin, and alternatively be an acrylic resin or a silicon resin.

At ends of the element substrate 10 on both sides, terminal portions 102 are present for supplying power to the organic EL layer, image signals, etc. to the display region 101. Although the terminal portion 102 is not covered with the adhesive member 30, because the lines are covered with an inorganic passivation film or an organic passivation film, the conductive film of the terminal portion 102 will not be corroded. In addition, the conductive film is not affected by the moisture as much as the organic EL layer.

FIG. 1 shows a solid sealing, and no space is formed between the sealing substrate 40 and the element substrate 10. Therefore, the problem in the case of the hollow sealing that a dark spot occurs due to contact of the sealing substrate 40 with the element substrate 10 when the sealing substrate 40 is pushed does not occur. In addition, various other problems due to internal pressure of the sealing gas during sealing do not occur.

In various embodiments of the present invention, a plurality of organic EL display panels 300 as shown in FIG. 1 are formed in a mother panel. In other words, a mother sealing sheet over which the adhesive member is provided is adhered to the mother element substrate to cover the plurality of display regions formed in a plurality of mother element substrates. Then, the sealing sheet is removed except for a portion of the sealing sheet to be left on the organic EL display panel. A characteristic of the present invention is in the removal method of the unnecessary portion of the sealing sheet.

FIG. 2 is a cross sectional view showing a display region of a top-emission type organic EL display device to which the present invention is applied. In the following description of the preferred embodiments, the present invention will be described referring to the top-emission type organic EL display devices, but the present invention is not limited to such a configuration, and can similarly be applied to a bottom-emission type organic EL display devices. Top-emission type organic EL display devices include a top anode type in which an anode exists over the organic EL layer and a top cathode type in which a cathode exists over the organic EL layer. Although FIG. 1 shows a top anode type, the present invention can similarly be applied to a top cathode type.

In FIG. 2, a first base film 11 comprising SiN and a second base film 12 comprising $SiO_2$ are formed over the element substrate 10, in order to prevent contamination of a semiconductor layer 13 by impurities from the glass substrate. The semiconductor layer 13 is formed over the second base film 12. As the semiconductor layer 13, an a-Si film is formed through CVD and is then converted to a poly-Si film through laser irradiation.

A gate insulating film 14 comprising $SiO_2$ is formed covering the semiconductor layer 13. A gate electrode 15 is formed at a location opposing the semiconductor layer 13 with the gate insulating film 14 therebetween. With the gate electrode 15 used as a mask, impurities such as phosphorous or boron are doped through ion implantation to the semiconductor layer 13 to give conductivity, and a source section or a drain section is formed in the semiconductor layer 13.

An interlayer insulating film 16 is formed with $SiO_2$ covering the gate electrode 15. The interlayer insulating film 16 is provided in order to insulate a gate line and a drain line 17. The drain line 17 is formed over the interlayer insulating film 16. The drain line 17 is connected to the drain of the semiconductor layer 13 through a through hole formed through the interlayer insulating film 16 and the gate insulating film 14.

Then, in order to protect the thin film transistor (TFT) thus manufactured, an inorganic passivation film 18 comprising SiN is deposited. An organic passivation film 19 is formed over the inorganic passivation film 18. The organic passivation film 19 has a function to more completely protect the TFT along with the inorganic passivation film 18, and also has a function to flatten a surface over which the organic EL layer 22 is formed. Therefore, the organic passivation film 19 is formed in a thick thickness of 1 μm-4 μm.

A reflective electrode 21 is formed over the organic passivation film 19 using Al or an Al alloy. In FIG. 1, the lower electrode and the reflective electrode are the same electrode. Because Al and the Al alloy have high reflectances, Al and the Al alloy are preferable as the reflective electrode 21. The reflective electrode 21 is connected to the drain line 17 through a through hole formed through the organic passivation film 19 and the inorganic passivation film 18.

In the following description of the preferred embodiments, a top anode type organic EL display device is shown, and, thus, the lower electrode 21 of the organic EL layer 22 is the cathode. Therefore, Al or the Al alloy which is used as the reflective electrode 21 can also function as the lower electrode 21 of the organic EL layer 22. Because the work functions of Al and the Al alloy are relatively low, Al and the Al alloy can function as the cathode.

The organic EL layer 22 is formed over the lower electrode 21. The organic EL layer 22 comprises, from the lower layer, an electron transporting layer, a light emitting layer, and a hole transporting layer. In some cases, an electron injecting layer may be provided between the electron transporting layer and the lower electrode 21. Similarly, in some cases, a hole injecting layer may be provided between the hole transporting layer and an upper electrode 23. The upper electrode 23 which functions as the anode is formed over the organic EL layer 22. In the following description of the preferred embodiments, IZO is used for the upper electrode 23. The IZO is evaporated over the entire display region without the use of a mask. IZO is formed with a thickness of approximately 30 nm, in order to maintain the transmittance of light. Alternatively, ITO may be used in place of IZO.

As the electron transporting layer, the material is not particularly limited as long as the material has an electron transporting capability and can easily be formed into a charge moving complex through co-evaporation with an alkali metal. Examples of the materials which can be used include, for example, metal complexes such as tris(8-quinolinolato)aluminum, tris(4-methyl-8-quinolinolato)aluminum, bis(2-methyl-8-quinolinolato)-4-phenylphenolato aluminum, bis[2-[2-hydroxyphenyl]benzooxazolato]zinc, 2-(4-biphenylyl)-5-(4-tert-butylphenyl)-1,3,4-oxadiazole, and 1,3-bis[5-(p-tert-butylphenyl)-1,3,4-oxadiazole-2-yl]benzene.

The material of the light emitting layer is not particularly limited as long as the material is formed by doping a dopant which emits a fluorescent or phosphorescent light by recombination of electrons and holes into a host material having a transporting capability of electrons and holes and which can be formed as the light emitting layer through co-evaporation. Examples of the host include complexes such as, for example, tris(8-quinolinolato)aluminum, bis(8-quinolinolato)magnesium, bis(benzo{f}-8-quinolinolato)zinc, bis(2-methyl-8-quinolinolato)aluminum oxide, tris(8-quinolinolato)indium, tris(5-methyl-8-quinolinolato)aluminum, 8-quinolinolato lithium, tris (5-chloro-8-quinolinolato)gallium, bis(5-chloro-8-quinolinolato)calcium, 5,7-dichlor-8-quinolinolato aluminum, tris(5,7-dibromo-8-hydroxyquinolinolato)aluminum, poly[zinc(II)-bis(8-hydroxy-5-quinolinyl)methane], anthracene derivatives, carbazole derivatives, etc.,.

As the dopant, a material may be used which captures the electrons and holes in the host, recombines the electrons and holes, and emits light. For example, the material may be a material which emits a fluorescent light such as a pyran derivative for red, a coumarin derivative for green, and an anthracene derivative for blue, or a material which emits phosphorescent light such as an iridium complex, a pyridinato derivative, etc.

For the hole transporting layer, for example, a tetra aryl benzidine compound (triphenyldiamine; TPD), aromatic tertiary amine, a hydrazone derivative, a carbazole derivative, a triazole derivative, an imidazole derivative, an oxadiazole derivative having an amino group, a polythiophene derivative, a copper phthalocyanine derivative, etc. may be used.

A bank 20 is formed between pixels in order to prevent breaking of the organic EL layer 22 by steps at the end. The bank 20 may be formed with an organic material in some cases or may be formed with an inorganic material such as SiN. When an organic material is used, in general, the bank 20 is formed with an acrylic resin.

An auxiliary electrode may be formed over the bank 20, over the upper electrode 23, in order to help conductance. This is in consideration of cases where a brightness unevenness occurs due to a large resistance of the upper electrode 23. In the following description of the preferred embodiments of the present invention, the auxiliary electrode is not used, but the present invention can be applied to the organic EL display device which uses the auxiliary electrode.

The adhesive member 30 is formed over the upper electrode 23. The adhesive member 30 comprises a thermosetting epoxy resin, and adheres the element substrate 10, more specifically, the upper electrode 23, with the sealing substrate 40 comprising an acrylic sheet or the like. The thickness of the adhesive member 30 is 10 μm-20 μm. The adhesive member 30 adheres to sealing substrate 40. In the following description of the preferred embodiments, the sealing sheet 40 comprises an acrylic sheet. Because acryl passes moisture, SiN is formed through sputtering inside the sealing sheet 40 in order to block moisture. When the sealing sheet 40 comprises glass, such a layer for blocking moisture is not necessary. In the following description of the preferred embodiments, SiN or the like which is sputtered in the sealing sheet 40 is not shown, in order to simplify the drawings.

Preferred embodiments of the present invention will now be described in detail.

Embodiment 1

Figure 3:
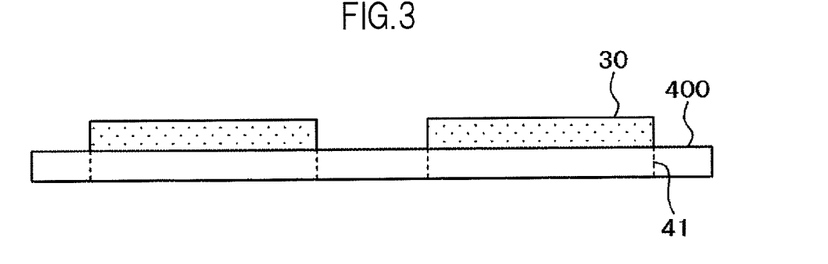
FIG. 3 is a cross sectional view of a mother sealing sheet.

FIG. 3 is a cross sectional view of a mother sealing sheet 400 over which a plurality of adhesive members 30 are formed. The mother sealing sheet 400 comprises an acrylic sheet. The SiN film which is formed in the acrylic sheet is not shown. The thickness of the acrylic sheet is set, for example, at approximately 100 μm. The adhesive member 30 for sealing the display region 101 of the organic EL display device is formed over the sealing sheet 40.

The adhesive member 30 comprises, for example, an epoxy resin, and has a thickness of 10 μm to 20 μm. A separation line 41 having a cut-out or the like is formed in a portion of the mother sealing sheet 400 having a same area as or a slightly wider area as the adhesive member 30. After the mother sealing sheet 400 and the mother element substrate 100 are affixed, unnecessary portions of the mother sealing sheet 400 is removed along the separation line 41.

Figure 4:
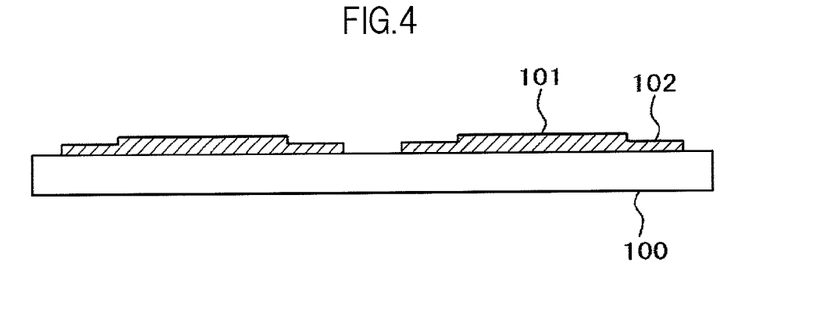
FIG. 4 is a cross sectional view of a mother element substrate.

FIG. 4 is a cross sectional view of the mother element substrate 100. In the mother element substrate 100, a plurality of pairs of a display region 101 and a terminal portion 102 are formed over a glass plate having a thickness of approximately 0.5 mm. Each pair is later separated and an organic EL display device is formed. Organic EL layers which emit light, thin film transistors (TFT) which control video signals or the like to the organic EL layers, etc., are formed in a matrix form in the display region 101.

Figure 5:
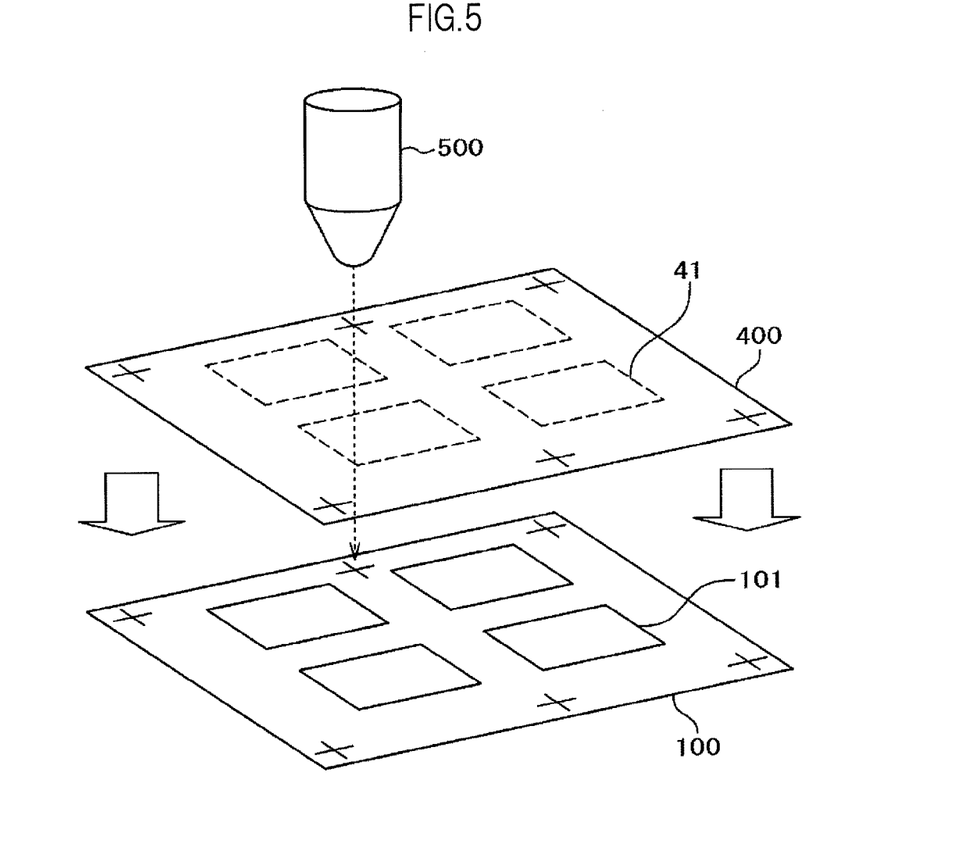
FIG. 5 is a diagram of a positioning step of a mother sealing sheet and a mother element substrate.

The mother sealing sheet 400 shown in FIG. 3 and the mother element substrate 100 shown in FIG. 4 are affixed, to form the mother panel 200. In this case, a positioning mark is used in order to accurately position the adhesive member 30 formed over the mother sealing sheet 400 and the display region 101 formed over the mother element substrate 100. FIG. 5 is a diagram showing the positioning using the positioning mark when the mother sealing sheet 400 and the mother element substrate 100 are affixed. In FIG. 5, the plus sign ("+") represents the positioning mark. For the positioning process, systems can be used that are known to be effective in the positioning process of a TFT substrate over which a TFT or a pixel is formed and a color filter substrate over which a color filter is formed, in the manufacturing of liquid crystal display devices. In FIG. 5, the positioning mark is detected with a camera 500, and the mother sealing sheet 400 and the mother element substrate 100 are positioned.

Because the mother sealing sheet 400 has a thickness of approximately 100 μm, and, thus, is thin, it is possible to position, when positioning is difficult, while supporting the mother sealing sheet 400 with a frame-shaped rim. In order not to involve bubbles, the affixing process is applied under a reduced pressure. After the mother sealing sheet 400 and the mother element substrate 100 are affixed in this manner, while a predetermined pressure is applied, a heating process is applied at 100° C. for about 2 hours or at 120° C. for about 30 minutes, so that the adhesive member 30 is cured. In this manner, the sealing effect by the adhesive member 30 is realized.

Figure 6:
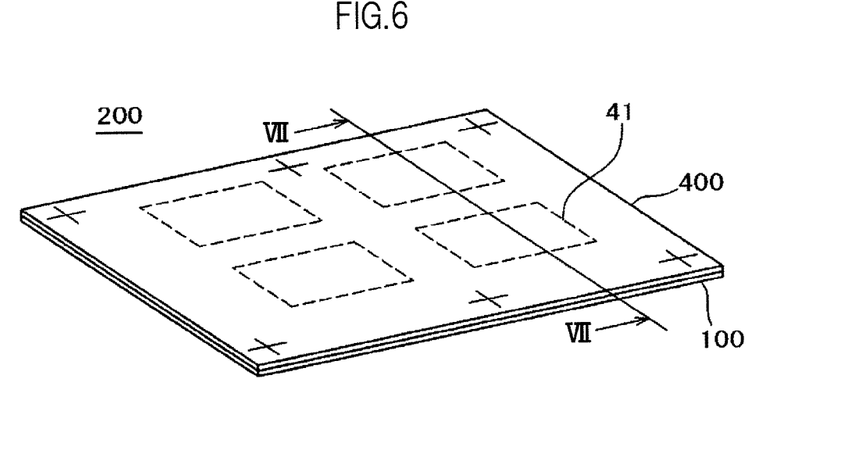
FIG. 6 is a diagram showing adhesion of a mother sealing sheet and a mother element substrate.

FIG. 6 shows a state where the mother sealing sheet 400 and the mother element substrate 100 are affixed with the use of the positioning mark, to form the mother panel 200. In FIG. 6, the adhesive member 30 is formed in a portion surrounded by a dotted line. The display region 101 formed over the mother element substrate 100 is covered with the adhesive member 30. The terminal portion 102, on the other hand, is not covered with the adhesive member 30.

Figure 7:
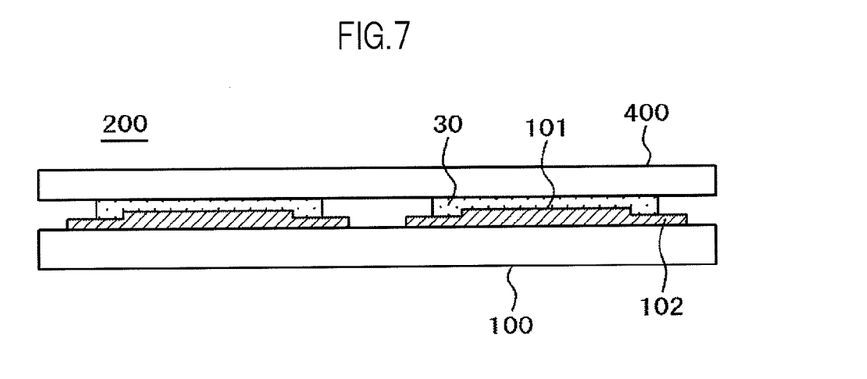
FIG. 7 is a cross sectional view showing adhesion of a mother sealing sheet and a mother element substrate.

FIG. 7 is a cross sectional view along a VII-VII line of FIG. 6. In FIG. 7, two organic EL elements are formed along a direction of the cross section of the mother element substrate 100. Terminal portions 102 extend from both sides of the display region 101 of the organic EL element. The adhesive member 30 covers the display region 101. The adhesive member 30, on the other hand, does not cover the terminal portion 102. The adhesive member 30 adheres to the mother sealing sheet 400. With the mother sealing sheet 400 and the adhesive member 30, the organic EL layers formed in the display region 101 in a matrix form are protected from moisture.

Figure 8:
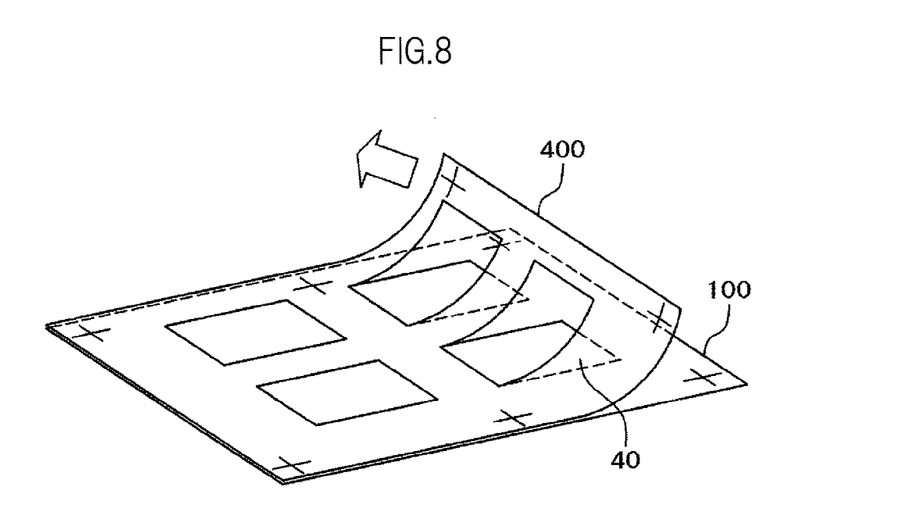
FIG. 8 is a diagram showing a structure where an unnecessary portion of a mother sealing sheet is removed from a mother element substrate.

FIG. 8 shows a state in which the unnecessary portion of the mother sealing sheet 400 is removed from the mother panel 200 in the state in which the mother sealing sheet 400 and the mother element substrate 100 are adhered. In FIG. 8, the adhesive member 30 and the sealing sheet 40 are left in a rectangular region shown with a dotted line. The mother sealing sheet 400 is detached with the rectangular region shown with the dotted line remaining in a window shape.

Figure 9:
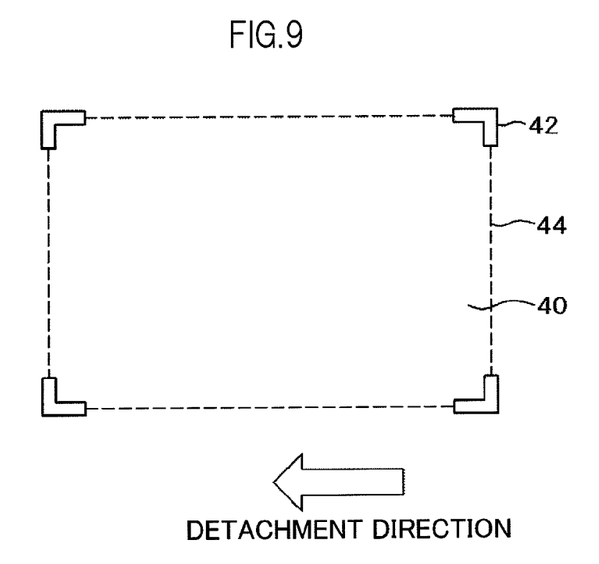
FIG. 9 is a diagram showing a separation line of a sealing sheet in a first preferred embodiment of the present invention.

In the rectangular region shown with the dotted line, in order to easily separate the sealing sheet 40 to be left on the organic EL display panel and the sealing sheet to be removed, a breaking surface is formed as shown in FIG. 9. In FIG. 9, the sealing film is detached in the direction of the arrow in FIG. 9. A characteristic of the breaking surface of FIG. 9 is that the corner portion having a particularly large stress during detachment of the sealing sheet 40 is cut out. In the other portions, a perforation 44 is formed.

In a structure with only the perforation 44, the detachment of the sealing sheet 40 cannot be realized with a high reproducibility, and, in particular, detachment of the adhesive member 30 is caused at the end of the adhesive member 30 of the sealing sheet 40, and a problem occurs in the reliability. Therefore, it is very important to provide the cut-out 42 at the corner portion. In particular, when the sealing sheet 40 is detached in the long side direction of the rectangle as shown in FIG. 9, it is important that the cut-out 42 is formed at the corner portion. By forming the cut-out 42 in the mother sealing sheet 400 as shown in FIG. 9, it is possible to easily remove the unnecessary portion of the mother sealing sheet 400, and, consequently, improve the reliability of the organic EL element.

Figure 10:
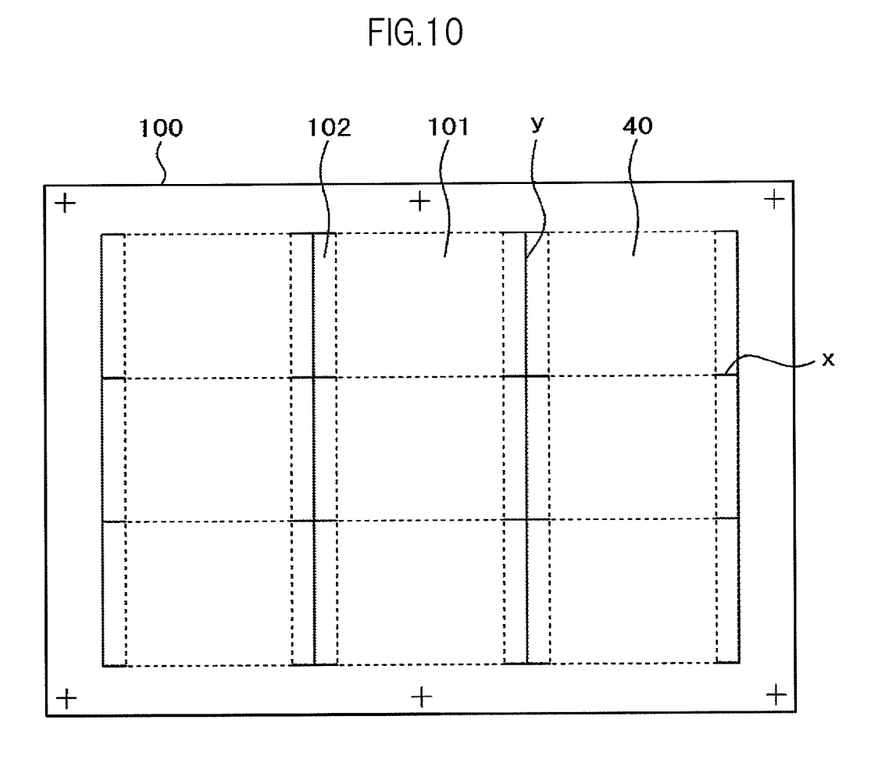
FIG. 10 is a plan view showing an example mother panel of a first preferred embodiment of the present invention.

FIG. 10 is a plan view showing the mother panel 200 after the unnecessary portion of the mother sealing sheet 400 is removed. In FIG. 10, nine organic EL elements each having the display region 101 and the terminal portion 102 are formed in one mother element substrate 100. In each organic EL element, the terminal portions 102 are formed on both short sides. In a portion of each organic EL element shown with a dotted line, the sealing sheet 40 and the adhesive member 30 are provided. With this structure, the display region 101 of the organic EL element is protected. On the other hand, the terminal portion 102 is not covered with the adhesive member 30 and the sealing sheet 40.

In this manner, to the mother panel 200 over which a plurality of organic EL elements are formed, scribe is formed from the side of the mother element substrate 100 along a line x and a line y shown in FIG. 10. Although the line x and the line y do not extend to the ends of the mother element substrate 100 in FIG. 10, the scribing extends to the end of the mother element substrate 100. Then, an impact is applied to the glass from the side of the element substrate 10, the glass breaks along the line x or the line y, and the mother panel 200 is separated into individual organic EL display panels.

In the sealing sheet 40 in the region of the dotted line in FIG. 10, the breaking surface of the sealing sheet 40 on which the perforation 44 is formed during the detachment and removal of the unnecessary portion of the mother sealing sheet 400 remains. The breaking surface is not left in the corner portion of the region of the dotted line, on the other hand, because the cut-out 42 has been formed in the corner portion.

Figure 11:
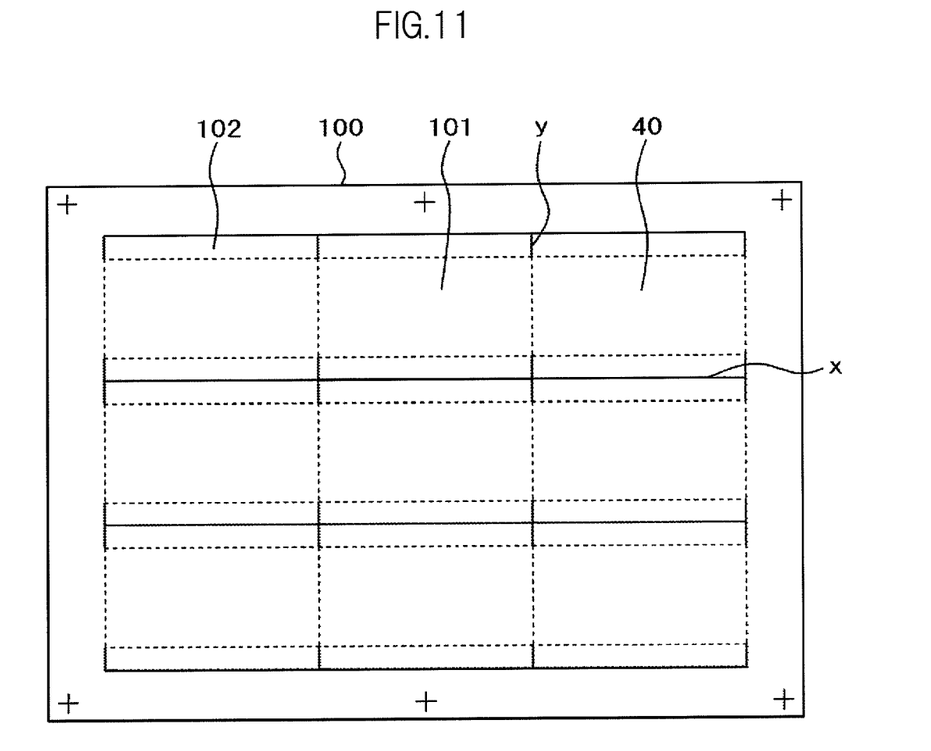
FIG. 11 is a plan view showing another example mother panel of a first preferred embodiment of the present invention.

FIG. 11 shows another example structure of the mother panel 200. Similar to FIG. 10, nine organic EL elements are formed over one mother element substrate 100, but the organic EL element of FIG. 11 differs from that of FIG. 10 in that the terminal portion 102 is formed on two sides on the side of the long side. In FIG. 11, the display region 101 of the organic EL element is formed in a region surrounded by the dotted line, and an adhesive and the sealing sheet 40 are provided over the display region 101. The other structures are similar to those described above with reference to FIG. 10.

Embodiment 2

As described above with reference to the first preferred embodiment, in the present invention, the shape of the separation line 41 for separating the portion over which the adhesive member 30 is formed and the portion to be removed during the process of removing the unnecessary portion of the mother sealing sheet 400 is very important. In particular, a large stress is applied to the breaking surface in a direction perpendicular to the detachment direction. In the first preferred embodiment, the cut-out 42 is formed in the corner portion where the largest stress is applied, but on the other short sides, only the perforation 44 is formed, and the detachment stress in the short side is problematic.

Figure 12:
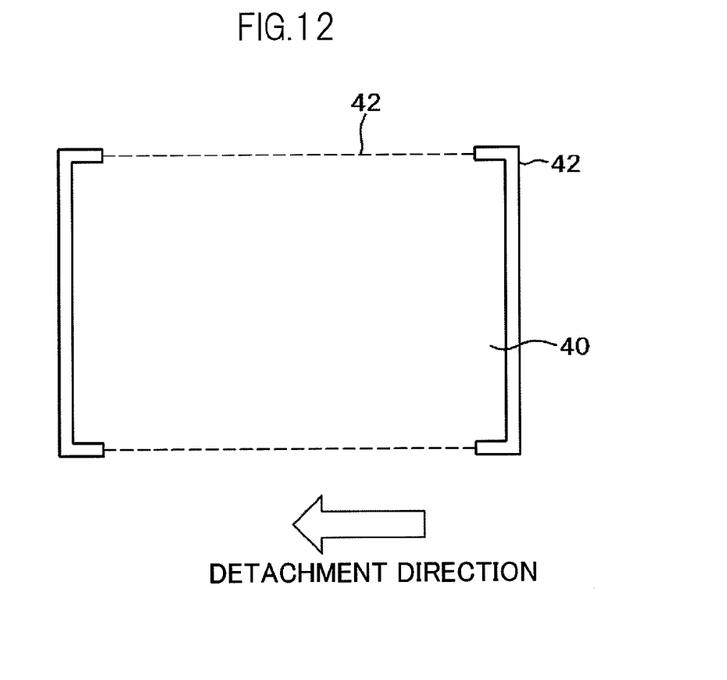
FIG. 12 is a diagram showing a separation line of a sealing sheet in a second preferred embodiment of the present invention.

The second preferred embodiment provides a countermeasure to the above-described point. FIG. 12 shows a shape of the separation line 41 of the mother sealing sheet 400 in the present embodiment. In FIG. 12, the cut-out 42 is formed in the corner portion and the short side portion where the stress is applied. Therefore, no stress is caused in this portion when the mother sealing sheet 400 is detached in the direction of the arrow of FIG. 12. On the long side portion, on the other hand, the perforation 44 is formed except for the corner portion. The other manufacturing steps are identical to those described above with reference to FIG. 1.

In this manner, according to the second preferred embodiment, because the cut-out 42 is formed at the corner portion and on the short side portion where a large stress is applied when the unnecessary portion of the mother sealing sheet 400 is detached, the stress of detachment is not applied to the adhesive member 30 which functions as the sealing member of the organic EL display device. Therefore, an organic EL display device having a high reliability with respect to the sealing effect against moisture can be realized.

Embodiment 3

Figure 13:
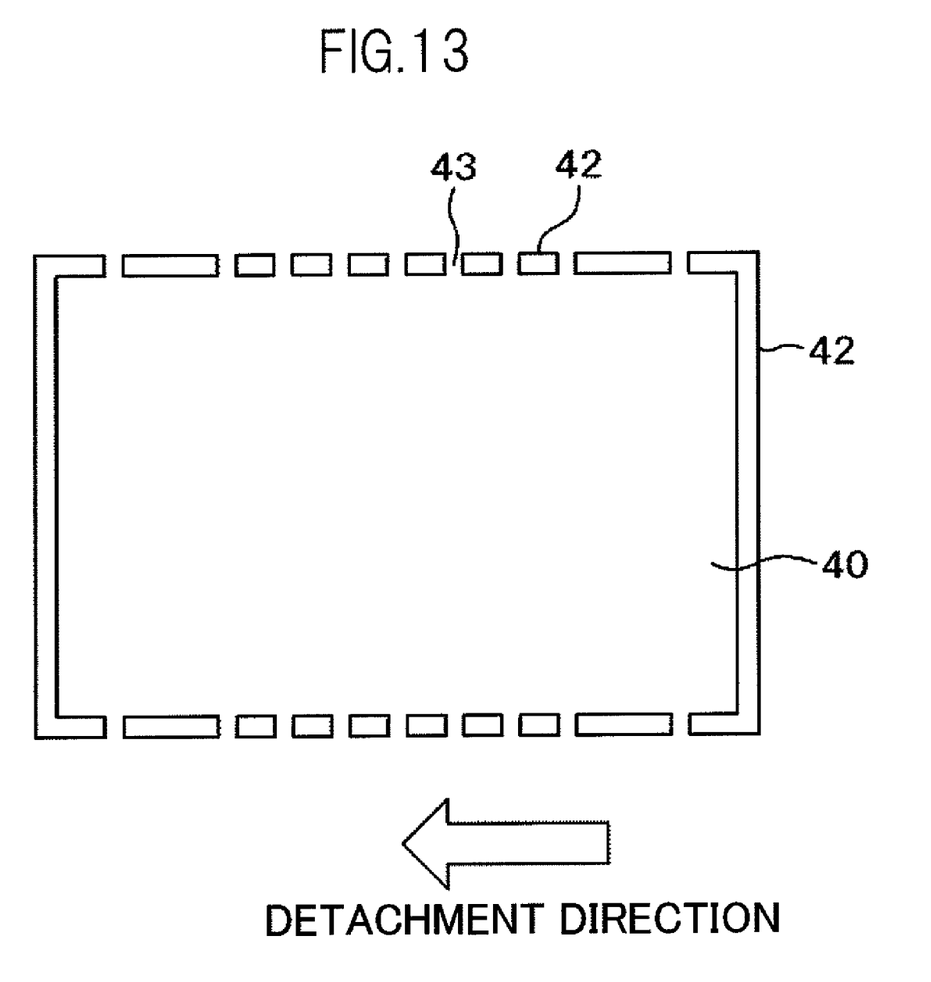
FIG. 13 is a diagram showing a separation line of a sealing sheet in a third preferred embodiment of the present invention.

FIG. 13 shows another example structure of the separation line 41 for separating a portion of the mother sealing sheet 400 over which the adhesive member 30 is formed and the portion to be detached. In FIG. 13, cut-outs 42 are formed at the corner portion and on the short side portion. Therefore, when the unnecessary portion of the mother sealing sheet 400 is detached in the direction of the arrow in FIG. 13, no stress is caused in the corner portion and the short side portion.

In the third preferred embodiment, as shown in FIG. 13, in place of the perforation 44, the cut-out 42 and a bridge portion 43 are alternately formed on the long side portion. By setting the cut-out 42 to be large and the bridge portion 43 to be small, it is possible to reduce the stress during the detachment. In the third preferred embodiment, the cut-out 42 formed on the long side becomes longer as the distance to the corner portion becomes shorter.

More specifically, because the stress when the mother sealing sheet 400 is detached is larger on the corner portion of the long side than the center of the long side, the amount of cut-out 42 is increased as the distance to the corner portion is reduced. In other words, the ratio of the cut-out 42 and the bridge portion 43 is such that the ratio of the cut-out 42 is increased as the position becomes nearer to the corner portion.

In this manner, in the third preferred embodiment, no stress is applied to the corner portion and the short side portion of the adhesive member 30 and only a small stress is applied to the long side during the removal of the unnecessary portion of the mother sealing sheet 400. Therefore, it is possible to further improve the reliability of the protection effect of the organic EL layer by the adhesive member 30.

Embodiment 4

In the second preferred embodiment, when the mother sealing sheet 400 is detached leaving the necessary portion, the stress at the corner portion and on the short side portion can be set to zero. However, for the long side portion, a slight stress is caused in the detachment portion. In the third preferred embodiment, the stress of the long side portion can be reduced compared to the second preferred embodiment. However, it is preferable that the stress during detachment of the unnecessary portion of the mother sealing sheet 400 be as small as possible, within a range where the shape is maintained.

Figure 14A:
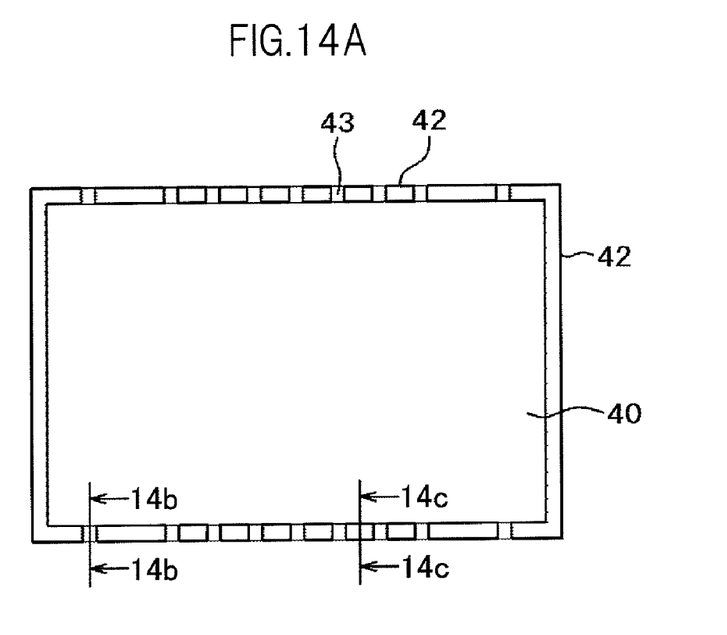
FIG. 14A is a diagram showing a separation line of a sealing sheet in a fourth preferred embodiment of the present invention.
Figure 14B:
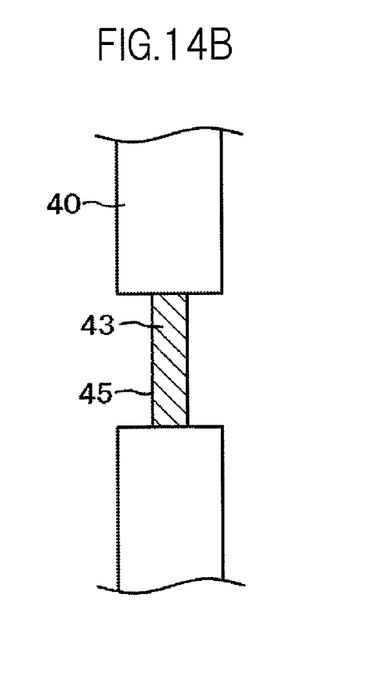
FIG. 14B is a cross sectional view along a 14b-14b line of FIG. 14A.
Figure 14C:
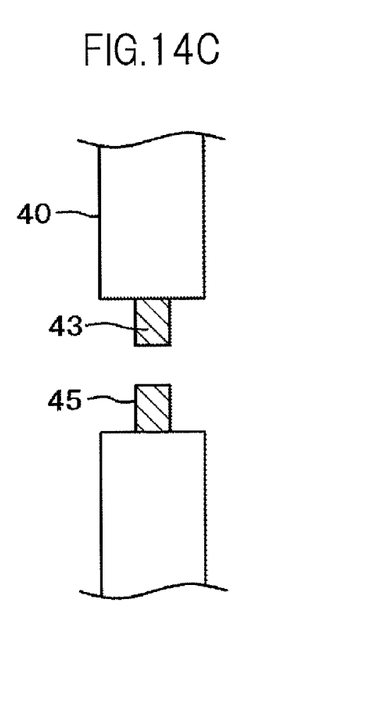
FIG. 14C is a cross sectional view along a 14c-14c line of FIG. 14A.

The fourth preferred embodiment further reduces the stress during detachment on the long side. FIGS. 14A, 14B, and 14C show a part of the mother sealing sheet 400 in the present embodiment. FIG. 14A is a plan view, FIG. 14B is a cross sectional view along a 14b-14b line of FIG. 14A, and FIG. 14C is a cross sectional view along a 14c-14c line of FIG. 14A.

In FIG. 14A, similar to the second and third preferred embodiments, the cut-out 42 is formed at the corner portion and on the short side portion. In addition, the cut-out 42 and the bridge portion 43 are alternately formed on the long side, in which, similar to the third preferred embodiment, the length of the cut-out 42 becomes longer as the position approaches the corner.

A characteristic of the fourth preferred embodiment is that a half-cut 45 is formed in the bridge portion 43 and the cut-out portion 42, as shown in FIGS. 14B and 14C. FIG. 14B is a cross sectional view along a 14b-14b line of FIG. 14A and FIG. 14C is a cross sectional view along a 14c-14c line of FIG. 14A. FIG. 14B shows a cross section of the bridge portion 43 and FIG. 14C shows a cross section of the cut-out portion 42. In FIGS. 14B and 14C, a cross section of the sealing sheet 40 is shown. The half-cut 45 is formed below and above the mother sealing sheet 400 in the thickness direction. With the half-cut 45, the stress on the long side during detachment can further be reduced. The stress can be adjusted with the depth of the half-cut 45.

In the fourth preferred embodiment, the stress on the long side during detachment of the mother sealing sheet 400 can be adjusted by the length of the cut-out 42 formed on the long side and the amount of the half-cut 45 formed in the bridge portion 43 and the cut-out portion 42, and, thus, the design tolerance can be improved. The adjustment of the strength by the cut-out 42 and the half-cut 45 can be determined from the view point of the stress of the detachment and the maintenance of the shape of the mother sealing sheet 400.

Figure 15:
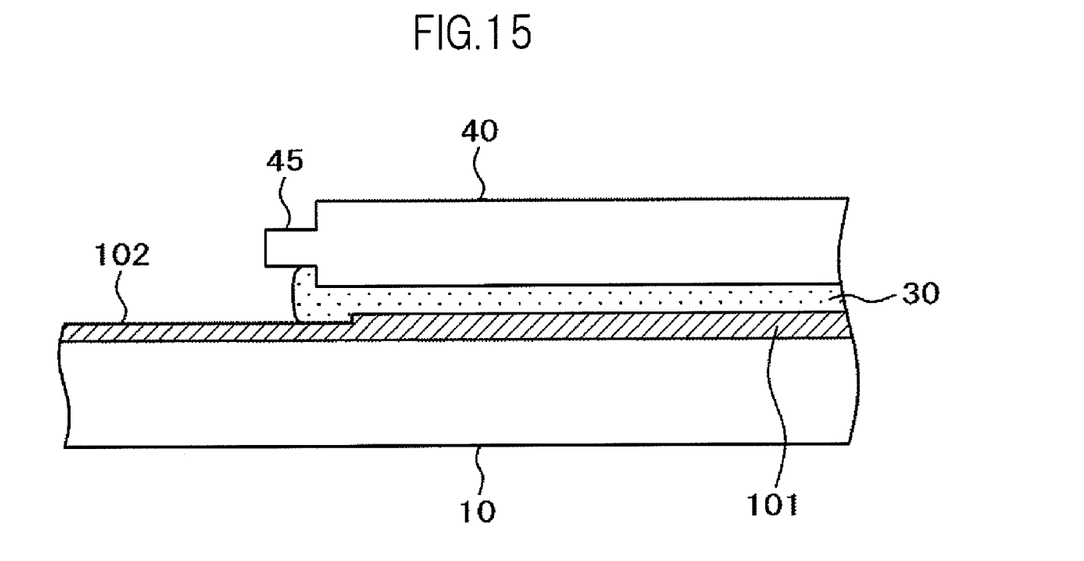
FIG. 15 is a cross sectional view of an organic EL display device which uses a sealing sheet of a fourth preferred embodiment of the present invention.

Another advantage of the fourth preferred embodiment of the present invention is shown in FIG. 15. FIG. 15 is a cross sectional view showing a shape of an end of the sealing sheet 40 of the organic EL display device. In FIG. 15, the adhesive member 30 is formed covering the display region 101 of the organic EL display device, and the adhesive member 30 is covered with the sealing sheet 40. When the mother sealing sheet 400 over which the adhesive member 30 is provided is adhered to the mother element substrate 100, a heating process is applied at a temperature of 100° C. or 120° C. and a predetermined pressure is applied. In this process, slight plastic deformation may occur in the adhesive member 30 and the adhesive member 30 may flow outside of the sealing sheet 40, as shown in FIG. 15.

As shown in FIG. 15, with the half-cut 45 at the periphery of the sealing sheet 40, even when the adhesive member 30 is plastically deformed, it is possible to prevent overflow of the adhesive member 30 to the outside of the sealing sheet 40. Therefore, the adhesive member 30 can always be protected by the sealing sheet 40, and the reliability of the seal of the organic EL display device can further be improved.

Figure 16A:
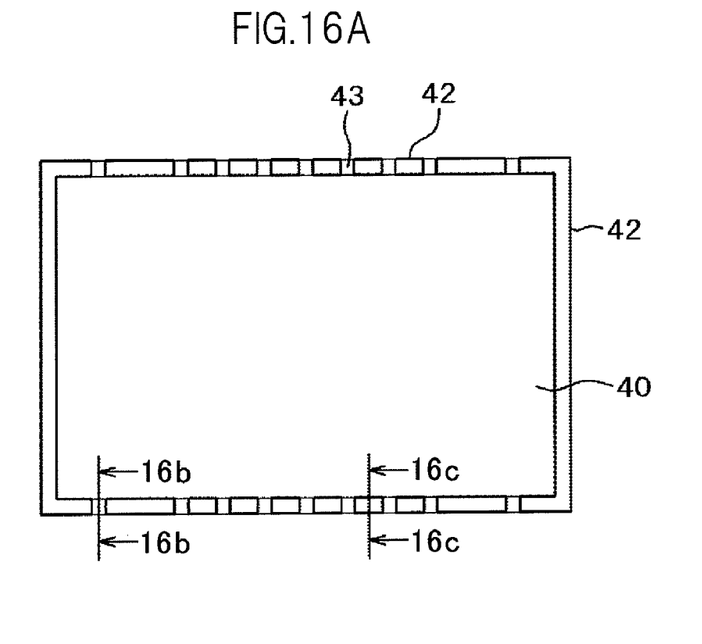
FIG. 16A is a diagram showing a separation line of a sealing sheet of an alternative configuration of a fourth preferred embodiment of the present invention.
Figure 16B:
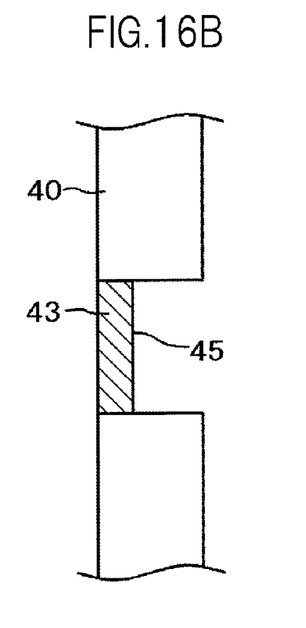
FIG. 16B is a cross sectional view along a 16b-16b line of FIG. 16A.
Figure 16C:
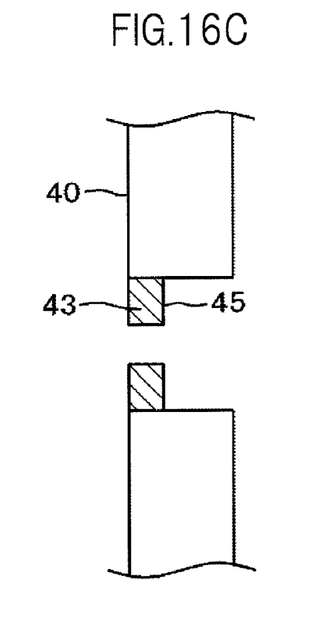
FIG. 16C is a cross sectional view along a 16c-16c line of FIG. 16A.

FIGS. 16A, 16B, and 16C show an alternative configuration of the fourth preferred embodiment. FIG. 16A is a plan view, FIG. 16B is a cross sectional view along a 16b-16b line of FIG. 16A, and FIG. 16C is a cross sectional view along a 16c-16c line of FIG. 16A. FIG. 16A is similar to FIG. 14A. A cross section of the bridge portion 43 shown in FIG. 16B and a cross section of the cut-out portion 42 shown in FIG. 16C differ from those of the above-described fourth preferred embodiment shown in FIGS. 14B and 14C.

In FIGS. 16B and 16C, the half-cut 45 is formed in the bridge portion 43 and the cut-out portion 42. FIG. 16B is a cross sectional view along a 16b-16b line of FIG. 16A and FIG. 16C is a cross sectional view along a 16c-16c line of FIG. 16A. A cross section of the bridge portion 43 is shown in FIG. 16B, a cross section of the cut-out portion 42 is shown in FIG. 16C, and a cross section of the sealing sheet 40 is shown in FIGS. 16B and 16C. The half-cut 45 is formed only on one side of the sealing sheet 40. Therefore, the formation of the half-cut 45 is easier compared to the above-described case of the fourth preferred embodiment. The strength of the bridge portion 43 and the cut-out portion 42 can be adjusted with the depth of the half-cut 45. In addition, similar to the above-described fourth preferred embodiment, the detachment stress on the long side portion can be adjusted with the length of the cut-out 42 formed on the long side portion and the depth of the half-cut 45 of the bridge portion 43 and the cut-out portion 42. Moreover, similar to the fourth preferred embodiment, the adjustment of the strength by the cut-out 42 and the half-cut 45 can be determined from the viewpoint of the detachment stress and the shape maintenance of the mother sealing sheet 400.

Figure 17:
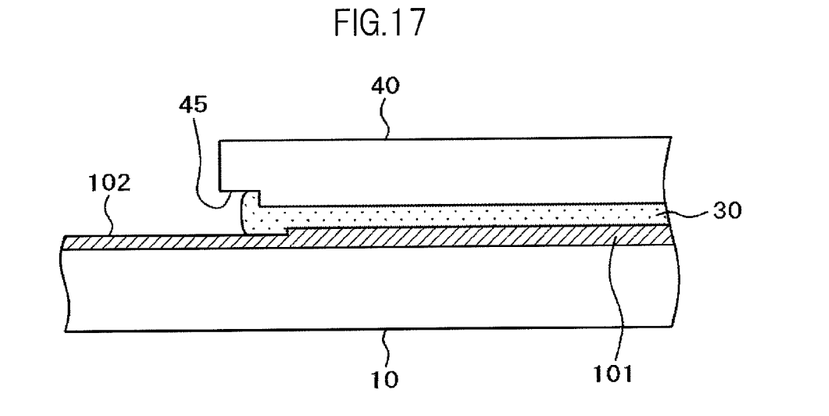
FIG. 17 is a cross sectional view of an organic EL display device which uses a sealing sheet of an alternative configuration of a fourth preferred embodiment of the present invention.
Figure 18A:
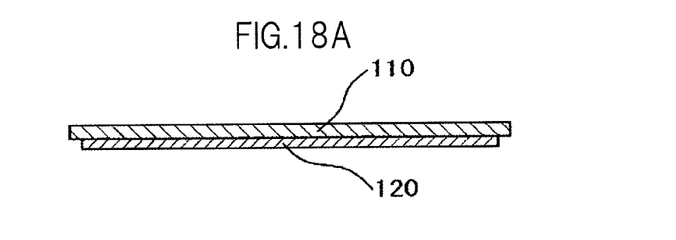
FIG. 18A is a diagram showing a technique of related art (JP 2004-139977 A).
Figure 18B:
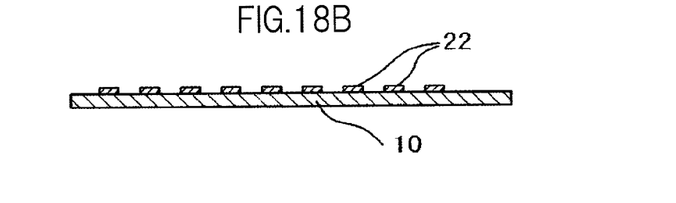
FIG. 18B is a diagram showing a technique of related art (JP 2004-139977 A).
Figure 18C:
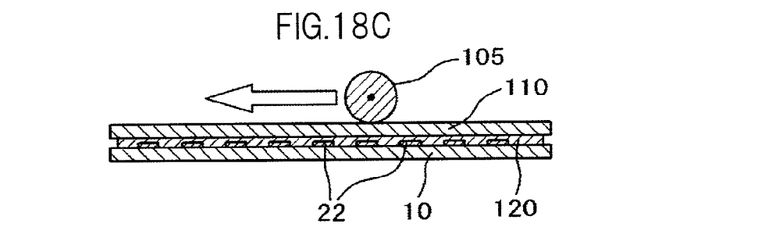
FIG. 18C is a diagram showing a technique of related art (JP 2004-139977 A).
Figure 18D:
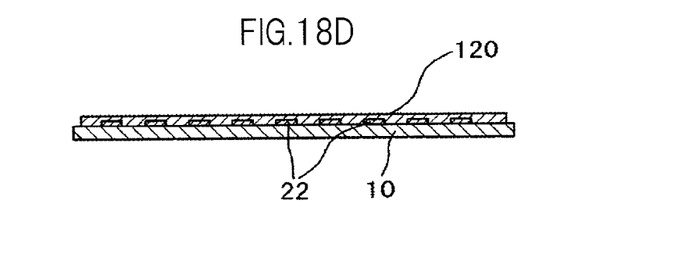
FIG. 18D is a diagram showing a technique of related art (JP 2004-139977 A).
Figure 19A:
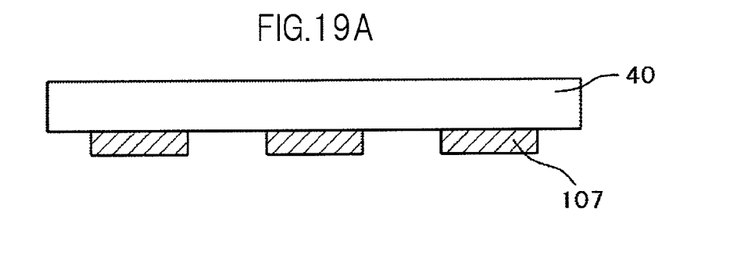
FIG. 19A is a diagram showing a technique of related art (Shinya SAEKI, Nikkei Electronics, Sep. 10, 2007, No. 960, pp. 10-11).
Figure 19B:
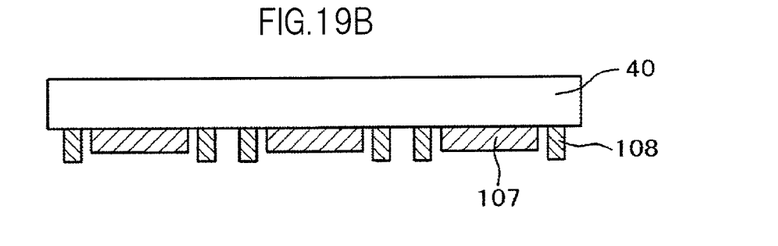
FIG. 19B is a diagram showing a technique of related art (Shinya SAEKI, Nikkei Electronics, Sep. 10, 2007, No. 960, pp. 10-11).
Figure 19C:
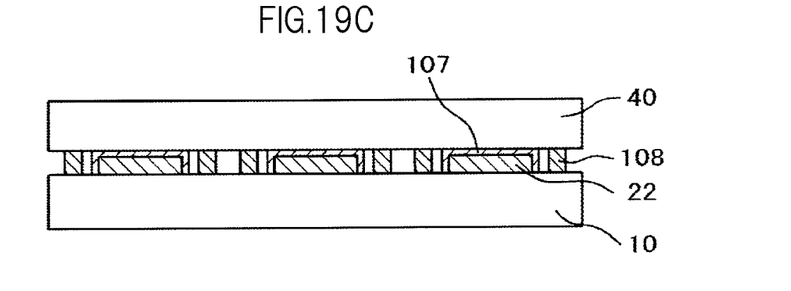
FIG. 19C is a diagram showing a technique of related art (Shinya SAEKI, Nikkei Electronics, Sep. 10, 2007, No. 960, pp. 10-11).
Figure 19D:
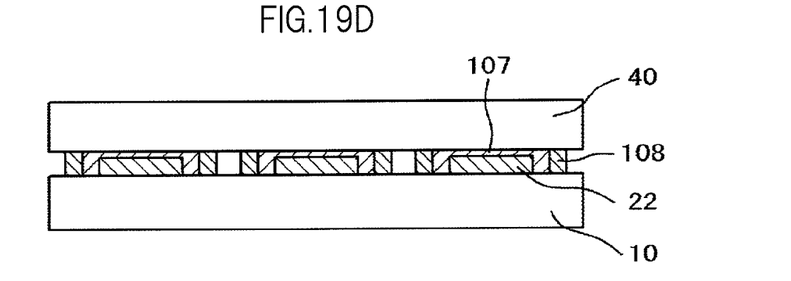
FIG. 19D is a diagram showing a technique of related art (Shinya SAEKI, Nikkei Electronics, Sep. 10, 2007, No. 960, pp. 10-11).
Figure 19E:
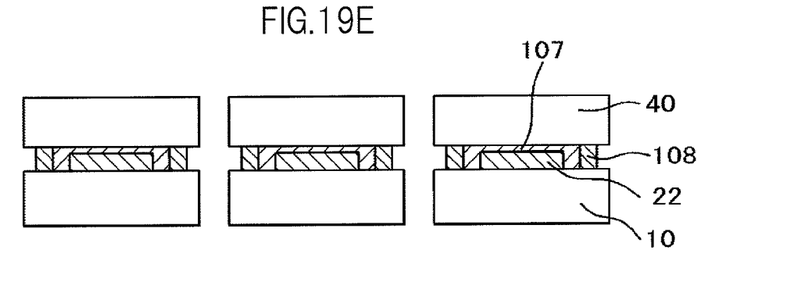
FIG. 19E is a diagram showing a technique of related art (Shinya SAEKI, Nikkei Electronics, Sep. 10, 2007, No. 960, pp. 10-11).

FIG. 17 shows another advantage of the alternative configuration of the fourth preferred embodiment. The cross sectional view of FIG. 17 is similar to FIG. 15 showing the above-described fourth preferred embodiment of the present invention except for the difference in the end of the sealing sheet 40. In other words, an advantage similar to the above-described fourth preferred embodiment can be achieved that the adhesive member 30 can be protected with the half-cut 45 when the adhesive member 30 is plastically deformed when the sealing sheet 40 is adhered to the element substrate 10. Therefore, similar to the above-described fourth preferred embodiment, it is possible to improve the reliability of the seal of the organic EL display device.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A method of manufacturing an organic electroluminescence display device which comprises an element substrate having a display region and a terminal portion and in which an adhesive member is formed covering the display region and a sealing sheet is adhered to the adhesive member, the method comprising:

positioning and adhering a mother sealing sheet in which a plurality of the sealing sheets are formed and a mother element substrate in which a plurality of the element substrates are formed, wherein a rectangular separation line is formed on the mother sealing sheet surrounding a portion over which the adhesive member is formed, a cut-out is formed at a corner portion of the rectangular separation line, and a perforation is formed on a long side and a short side of the rectangle;

forming a mother panel by removing, at the separation line, a portion which is not used as the sealing sheet in the organic electroluminescence display device; and separating individual organic electroluminescence display device from the mother panel by detaching the mother sealing sheet in one direction.

2. The method of manufacturing an organic electroluminescence display device according to claim 1, wherein the mother sealing sheet comprises a resin.

3. A method of manufacturing an organic electroluminescence display device which comprises an element substrate having a display region and a terminal portion and in which an adhesive member is formed covering the display region and a sealing sheet is adhered to the adhesive member, the method comprising:

positioning and adhering a mother sealing sheet in which a plurality of the sealing sheets are formed and a mother element substrate in which a plurality of the element substrates are formed, wherein a rectangular separation line is formed on the mother sealing sheet surrounding a portion over which the adhesive member is formed and a cut-out is formed at a corner portion and an overall short side portion of the rectangular separation line;

forming a mother panel by removing, at the separation line, a portion which is not used as the sealing sheet in the organic electroluminescence display device; and separating individual organic electroluminescence display device from the mother panel by detaching the mother sealing sheet in one direction.

4. The method of manufacturing an organic electroluminescence display device according to claim 3, wherein
a perforation is formed on a long side of the rectangular separation line.

5. The method of manufacturing an organic electroluminescence display device according to claim 3, wherein
a cut-out portion and a bridge portion are alternately formed on a long side of the rectangular separation line.

6. A method of manufacturing an organic electroluminescence display device according to claim 3, wherein
a cut-out portion and a bridge portion are alternately formed on a long side of the rectangular separation line, and
ratios of the cut-out portion and the bridge portion are such that the ratio of the cut-out portion is increased at positions nearer to the corner portion of the rectangle.

7. The method of manufacturing an organic electroluminescence display device according to claim 3, wherein
the bridge portion and the cut-out portion have thicknesses which are thinner than thicknesses in other portions of the sealing sheet.

8. An organic electroluminescence display device which comprises a rectangular element substrate having a display region and a terminal portion and in which an adhesive member is formed covering the display region and a rectangular sealing sheet is adhered to the adhesive member, wherein
the sealing sheet has a cutting surface at, a corner portion, and a breaking surface is formed on the short side portion and the long side portion, and
the length along a short side direction at the corner portion of the sealing sheet is shorter than the length along the short side direction at an other portion of the sealing sheet.

9. The organic electroluminescence display device according to claim 8, wherein
the breaking surface is formed by removing the unnecessary portion of the mother sealing sheet after adhering the sealing sheet formed in the mother sealing sheet and the element substrate.

10. An organic electroluminescence display device which comprises a rectangular element substrate having a display region and a terminal portion and in which an adhesive member is formed covering the display region and a rectangular sealing sheet is adhered to the adhesive member, wherein
the sealing sheet has a cutting surface at a corner portion and an overall short side portion, and a breaking surface and a cutting surface are alternately formed on a long side portion, and
the length along a short side direction at the cutting surface of the sealing sheet is shorter than the length along the short side direction at the breaking surface of the sealing sheet.

11. The organic electroluminescence display device according to claim 10, wherein
ratios of the cutting surface and the breaking surface at the long side portion of the sealing sheet are such that the ratio of the cutting surface is greater than the ratio of the breaking surface at positions nearer to the corner portion of the rectangle than a center portion of the long side.

12. The organic electroluminescence display device according to claim 11, wherein
the breaking surface and the cutting surface at the long side portion of the sealing sheet have thicknesses which are thinner than thicknesses of other portions of the sealing sheet.

13. The organic electroluminescence display device according to claim 10, wherein
the breaking surface is formed by removing the unnecessary portion of the mother sealing sheet after adhering the sealing sheet formed in the mother sealing sheet and the element substrate.

* * * * *